United States Patent [19]
Yamagishi et al.

[11] Patent Number: 5,386,430
[45] Date of Patent: Jan. 31, 1995

[54] EXCIMER LASER PROCESSING METHOD AND APPARATUS

[75] Inventors: Yasuo Yamagishi; Kanae Shimizu; Daisuke Mizutani; Tamotsu Owada; Yoshikatsu Ishizuki; Hideya Hashii, all of Kawasaki, Japan

[73] Assignee: Fujitsu Limited, Kawasaki, Japan

[21] Appl. No.: 92,498

[22] Filed: Jul. 16, 1993

[30] Foreign Application Priority Data

Jul. 20, 1992 [JP] Japan .................................. 4-192446
Mar. 18, 1993 [JP] Japan .................................. 5-058989

[51] Int. Cl.⁶ .......................... H01S 3/22; B05D 3/06; B29C 37/00; B23K 26.00
[52] U.S. Cl. ..................................... 372/57; 372/31; 372/108; 372/109; 427/554; 427/555; 156/643; 156/668; 219/121.6; 219/121.68; 219/121.69; 219/121.7; 219/121.71
[58] Field of Search .................. 372/31, 57, 73, 108, 372/109; 427/554, 555, 558, 572, 582, 586, 596, 493, 508, 487, 551; 219/121.6, 121.61, 121.63, 121.67, 121.68, 121.69, 121.7, 121.71, 121.72; 156/643, 668

[56] References Cited

U.S. PATENT DOCUMENTS

| | | | |
|---|---|---|---|
| 4,340,617 | 7/1982 | Deutsch et al. | 427/53.1 |
| 4,414,059 | 11/1983 | Blum et al. | 219/121 X |
| 4,868,005 | 9/1989 | Ehrlich et al. | 427/53.1 |
| 4,925,523 | 5/1990 | Braren et al. | 156/643 |
| 5,073,687 | 12/1991 | Inagawa et al. | 219/121.7 |
| 5,211,805 | 5/1993 | Srinivasan | 156/643 |

FOREIGN PATENT DOCUMENTS

| | | | |
|---|---|---|---|
| 3913785 | 10/1990 | Germany | 219/121.7 |
| 91/11090 | 7/1991 | WIPO | 219/121.7 |

OTHER PUBLICATIONS

Znotins et al., "Excimer Lasers: An Emerging Technology in Materials Processing," *Laser Focus/Electro-Optics*, May 1987, pp. 54–71.

Ishizaka, S., "Application of Excimer Laser to Fine Processing," *Applied Mechanical Optics*, Sep. 1990, pp. 94–99.

*Patent Abstracts of Japan*, vol. 17, No. 222 (M-1404), May 7, 1993 & JP-A-4 356388 (Fujitsu Ltd), Dec. 10, 1992.

*Primary Examiner*—Brian Healy
*Attorney, Agent, or Firm*—Staas & Halsey

[57] ABSTRACT

An excimer laser ablation processing for forming via holes in a resin film by irradiation of an excimer laser wherein, the emission of light caused during the decomposition of the resin during the processing is detected, its intensity is measured, and the endpoint of the processing is judged or a comparison is made of the positions of light emission and the design positions for processing to examine for the presence of defects. Provision is made of a means for measuring the intensity and a means for judging the endpoint of the processing from the changes in the intensity of light emission during the processing.

24 Claims, 11 Drawing Sheets

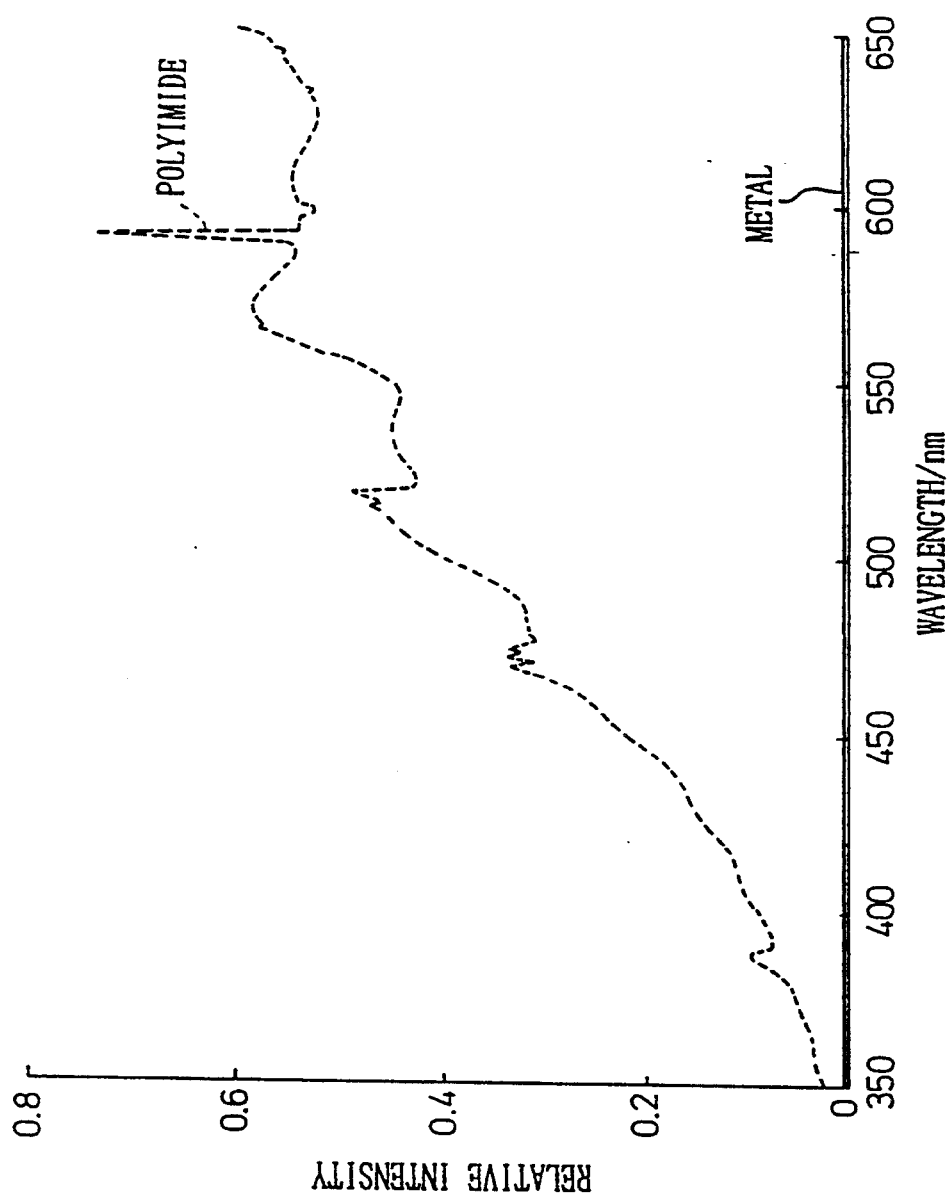

EXCIMER LASER PROCESSING METHOD AND APPARATUS

BACKGROUND OF THE INVENTION

1. Field of the Invention

The present invention relates to an excimer laser processing method and apparatus. More particularly, it relates to an excimer laser processing method and apparatus, wherein the end of the processing is suitably judged and the presence of defects is judged during the processing, in excimer laser ablation processing for forming via holes in a resin film by irradiation of an excimer laser.

2. Description of the Related Art

In recent years, attention has been drawn to ablation processing using an excimer laser as a new processing technique.

An excimer laser is a gas laser using excitation of a rare gas and a halogen and emitting a high intensity ultraviolet beam. Ordinary substances exhibit a strong absorption of ultraviolet beams, and therefore, when irradiated by a strong light pulse (e.g., about 100 MW/cm$^2$) such as of excimer laser light, chemical bonds are destroyed in an instant and the surface layer evaporates (ablation). This phenomenon is used in excimer laser processing. There are numerous combinations of rare gases and halogens, but those used most often for processing materials are KrF (wavelength of 248 nm), XeCl (wavelength of 306 nm), and ArF (wavelength of 193 nm).

In laser processing, conventionally use has been made of the heat energy of infrared beams such as YAG and $CO_2$ lasers. However, such processing results in large surrounding heat damage. The beam is focused for the processing, but it is difficult to make the diameter of the beam spot sufficiently small since infrared light has a long wavelength. Also, since spot processing is involved, the throughput cannot be improved.

As opposed to this, an excimer laser mainly uses the process of breaking chemical bonds by light; therefore, the processed cross-section is clean in finish. Also, it is possible to process a relatively wide area (e.g., up to about 10 mm$^2$) at one time. Consequently, a fine pattern can be easily formed by exposure through a mask. (See for example T. A. Znotins et al.; Laser Focus, 54, May 1987, Ishizaka: Applied Mechanical Optics, September 1990 issue, etc.)

An excimer laser can be used for processing or marking metals or ceramics, but is most impressive when it comes to processing polymers. Studies are under way on applications to polyimides and other difficult-to-process polymers.

Among the fields where attention is being drawn to the usefulness of ablation processing by excimer lasers is the formation of holes (i.e., via hole processing) for connecting wiring between layers in layer insulation films of multilayer wiring substrates. Circuit substrates are being constructed of multilayers to enable higher density packaging of electronic components, and circuit patterns are being made finer as well. Therefore, even in circuit substrates, attention is being drawn to the thin film method of laying wiring one layer at a time in the same way as multilayer wiring is done in semiconductor devices. The thin film method has been long known to be suited for high density packaging, but there have been few cases of actual application due to the difficulty in formation of via holes for connection between layers.

Due to the requirements for heat resistance at the time of soldering, use is made mainly of polyimide, which has a superior heat resistance, as the thin film insulating material. However, in the thin film method, the thickness of the insulating film on the circuit substrate is several tens of microns, which is an order of thickness greater than that of the semiconductor device. Accordingly, it was difficult to form fine holes in a difficult-to-process material like a polyimide by a reliable, convenient process.

For example, in a process for etching using pattern exposure of a heat curing material, problems such as difficulty of light penetrating to under the film; holes of only up to 3 times the size of the thickness of the film being able to be formed at most in wet etching by a solvent; a reverse tapering of the hole in sectional shape, making miniaturization impossible, exist.

In the dry etching process where a resist film is formed on the resin film, finer holes can be formed; however the process is complicated. Further, it is difficult to find a resist suited to a polyimide (one with large selectivity in etching).

As opposed to this, ablation processing by an excimer laser enables formation of holes with an extremely good shape faithful to the mask by a process of just exposure. Consequently, this method has been coming under focus as a good technique for making via holes in difficult-to-process films.

One of the problems in the case of forming via holes is how to monitor and manage the progress in processing. In excimer laser processing, the resin film is etched to a thickness corresponding to the intensity of the light with each shot. The processing proceeds until the underlying electrodes are exposed. Accordingly, when the number of irradiation shots is insufficient, the intensity of the light drops for some reason or another, or the film to be processed has locally thicker areas, the electrodes will not be exposed and defective connection between layers will result. On the other hand, when the number of shots is excessive, time is wasted in processing, the under lying electrodes will be damaged, and the heating of the electrode metal will cause heat deterioration of the resin film.

Therefore, monitoring the state of progress of processing is necessary to enable processing to be ended at the required sufficient number of shots. In the past, the number of irradiation shots had been set by determining certain conditions in advance; however, the number of necessary irradiation shots varies due to fluctuations in the output of the laser, changes in the distribution of light intensity in the beam, deterioration of the optical components, and variations in film thickness. Thus, it was necessary to frequently reset the conditions.

On the other hand, an important process in the processing of via holes is inspection for defects. An inspection process is essential regardless of the method adopted for making the via holes. In particular, in a multilayer thin film circuit, when defects in the lower layer are overlooked, in many cases all the processes applied on top of it become wasted. Therefore, stringent checks not allowing any mistakes become necessary. In many cases, this requires more steps than the process for forming the via holes itself and necessitates expensive facilities. There are various types of processing defects, as illustrated in FIGS. 1(a)–1(d), which may occur in, for example, a multilayer thin film circuit having a substrate 100 and a conductor 101, which can be roughly classified into the following:

(a) No via hole is made at the location where such a hole should inherently be made (see FIG. 1(a)).

(b) The via hole does not reach to the underlying electrode (conductor) (see FIG. 1(b)).

(c) A hole is made at location where no hole should inherently be made (see FIG. 1(c)).

(d) The via hole and underlying electrode (conductor) are deviated in position with each other (see FIG. 1(d)) in, for example, a multilayer thin film circuit, having a layer to be processed 102 and a layer after processing 103.

Various optical techniques for inspecting for defects involving the detection of light reflected from the surface of the insulating material, fluorescence from the insulating material, etc. and extraction of contours using the same, have been developed and put into practical use. However, with contour extraction of reflected surface light, it is difficult to detect the defects of FIG. 1(b) and (d), although the defects of FIG. 1(a) and (c) can be detected. When the insulating material is transparent and the circuit consists of only a single layer, it is possible to inspect for deviations in position, as shown in FIG. 1(d), by using light reflected from the supporting substrate 100, such as Si, and light reflected from the insulating film, for pattern recognition and comparison of the two reflected lights against each other. However, when the circuit consists of multiple layers, the wiring of the layer further below the wiring layer where the via holes are formed becomes an obstacle, making inspection difficult.

SUMMARY OF THE INVENTION

Accordingly, the objects of the present invention are to enable the required sufficient laser irradiation in ablation processing by an excimer laser and to enable accurate judgment of the end of the processing, thereby preventing incomplete processing and damage to the underlying layers.

Other objects of the present invention are to monitor the light emission from an etching point (a phenomenon unique to laser ablation processing) detect to what location the processing has proceeded, and detect the exposure of the underlying electrode by the cessation of light emission from the processing point. This permits inspection for defects to occur simultaneously with the processing, and provides a method and apparatus for excimer laser processing which enables simultaneous inspection by use of the above technique.

In accordance with the present invention, there is provided, in the excimer laser ablation processing for forming via holes in a resin film by irradiation of an excimer laser, an excimer laser processing method wherein the emission of light caused during the decomposition of the resin during the processing is detected, the intensity thereof is measured, and the endpoint of the processing is judged from the changes in the intensity of light emission during the processing.

In accordance with the present invention, there is also provided, in excimer laser ablation processing for forming via holes in a resin film by irradiation of an excimer laser, an excimer laser processing apparatus comprised of a detector for detecting light emission caused during decomposition of resin during the processing and measuring the intensity thereof and a means for judging the endpoint of the processing from the changes in the intensity of light emission during the processing.

In accordance with the present invention, there is further provided, in excimer laser ablation processing for forming via holes in a resin film by irradiation of an excimer laser, an excimer laser processing method wherein the emission of light caused during the decomposition of the resin during the processing is detected, the position of light emission is detected, the detected light emission position and design processing position are compared, and the comparison of the light emission position and design position is used to inspect for the presence of defects.

In accordance with the present invention, there is still further provided, in excimer laser ablation processing for forming via holes in a resin film by irradiation of an excimer laser, an excimer laser processing apparatus which takes an image of the light emission caused during the decomposition of the resin during the processing, identifies the positions of light emission, compares the identified positions of light emission and the design positions for formation of the via holes, and uses the comparison of the positions of light emission and design positions to inspect for the presence of defects.

In accordance with the present invention, there is still further provided, an excimer laser ablation processing for forming via holes in a resin film by irradiation of an excimer laser, an excimer laser processing method wherein the proximity of the surface of a processed material is made an oxygen gas atmosphere.

BRIEF DESCRIPTION OF THE DRAWINGS

The present invention will be better understood from the description set forth below with reference to the accompanying drawings, wherein:

FIG. 2 is a graph to aid in understanding the present invention and to show the spectrum of light emission in the visible range at the time of ablation of a polyimide resin by a KrF excimer laser;

DESCRIPTION OF THE PREFERRED EMBODIMENTS

According to the present invention, the light emission from plasma, generated by the decomposition of the resin, is monitored so as, for example, to detect the exposure of the underlying electrode, whereby the endpoint of the processing is determined. Further, the positions of light emission detected by monitoring the light emission and the design positions to be processed are compared against each other. The coincidence or non-coincidence between the two is used for inspection for the presence of defects.

FIG. 2 is a view explaining the principle of the present invention.

When a resin decomposes due to laser ablation, the fragments thereof become plasma and emit light. FIG. 2 shows the spectrum of light emission of the visible range in ablation of a polyimide resin by a KrF excimer laser. When a via hole is formed and the underlying metal (land) is exposed, the light emission due to the decomposition of the resin stops, so the intensity of light emission weakens remarkably. Accordingly, by detecting the intensity of the light emission from a processing point, it is possible to confirm the end of the processing. When this information is fed back to the laser oscillator to stop the oscillation, it is possible to end the processing with the minimum necessary extent of irradiation.

Figure 1A:
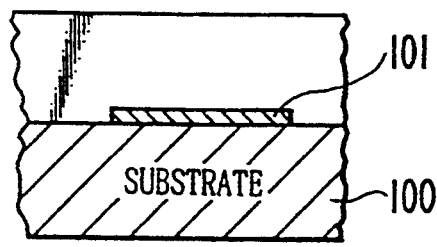
FIG. 1(a) is a view showing a type of defect which occurs in excimer laser processing.
Figure 1B:
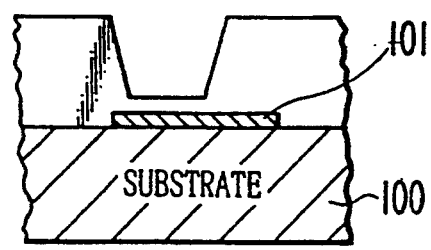
FIG. 1(b) is a second view showing a type of defect which occurs in excimer laser processing.
Figure 1C:
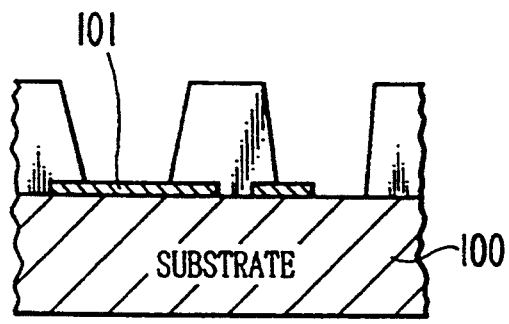
FIG. 1(c) is a third view showing a type of defect which occurs in excimer laser processing.
Figure 1D:
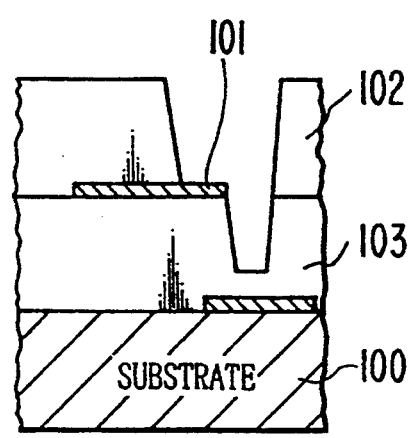
FIG. 1(d) is a fourth view showing a type of defect which occurs in excimer laser processing.

Further, at the position of formation of a via hole, the start of irradiation by the laser pulse results in the insulating material, that is, the resin, being etched while its decomposition gas emits light. As the etching proceeds, due to the cumulative irradiation, the hole becomes deeper. When the bottom of the hole reaches the underlying electrode, the etching stops, and therefore, light is no longer emitted. Accordingly, by detecting at what position the light is emitted, by a monitor camera or other optical means and comparing the coordinates of the light emitting portion with the design data of the via holes to be formed, it is possible to detect the defect of an absence of a via hole of FIG. 1(a) and the defect of a via hole of FIG. 1(b). Further, along with the increase in the number of irradiation shots, the underlying electrode (i.e., land) is exposed and the light emission from the position first emitting light stops. However when the film is locally built up due to, for example, foreign matter in the resin coating film, the land will not be exposed at that portion and the emission of light will continue. Therefore, it is possible to detect the defective exposure of the land of FIG. 1(b). In addition, when the defect of FIG. 1(d) occurs due to the deviation of the position of the underlying land or the defective positioning of the laser processing mask, light emission from almost all areas will stop and the number of shots will increase; however, despite this, light emission will continue from particular via holes and particular areas of via holes. Therefore, it is possible to identify the positions where light emission continues as being defective points.

It should be noted that the above-mentioned defects occur in excimer laser processing involving exposure through a mask in the following cases:

(a) Defect of absence of hole: Occurs when the appropriate pattern is not formed in the mask, but this seldom proves a problem since the mask is usually inspected before use.

(b) Incomplete penetration: This may possibly occur relatively frequently, due to defects in the formation of the film, such as uneven coating of the resin film or foreign objects.

(c) Pinhole defects: This arises due to pinholes in the mask. Although this does not prove a problem in a mask comprised of a metal sheet with holes made in it, with a mask comprised of a patterned quartz glass sheet on which a light shielding layer is formed, in addition to the initial defects, these defects sometimes occur due to deterioration of the light shielding layer along with repeated use.

(d) Poor positioning: This includes poor positioning of the via hole formation mask and poor positioning at the time of formation of the underlying electrode pattern. In multilayer circuits, poor positioning often accumulates. This is a defect arising not from the processing step itself, but from the previous step.

When it is only necessary to detect the presence of the above defects, then it is not necessary to identify the positions of the defects. However, in practice, correction is made in accordance with the mode of the defect detected, so it is necessary to identify the positions of the defects. Identification of a defective via hole requires a precision of $\pm 50\%$ of the pitch between via holes. In excimer laser processing, the smallest via hole diameter industrially possible is about 20 $\mu$m (opening portion). In this case, the basic grid is expected to be about 100 $\mu$m. Therefore, $\pm 50$ $\mu$m is required. This level of precision is fully achievable by detection of the positioning marks on the substrate being processed through a monitor camera and calculation of the distance from there. Caution is required in detection of the position in that the light emission does not occur from the processing surface, but occurs from the plasma generated by the processing. Therefore, the portion emitting light is wider than the diameter of the hole being processed. By adjustment of the gain of the monitor camera, however, it is possible to suppress the spread of the portion emitting light to about 20 $\mu$m. Therefore, considering the fact that the pitch in the basic grid is about 100 $\mu$m at the smallest, this does not obstruct identification of a defective via hole.

When processing by a projection exposure method, however, as shown in, for example, FIG. 6, explained later, it is possible to set the path of laser light and the path of light for monitoring and receive the emitted light from a processed area with a camera. However, in contact exposure where a mask is laid over the processed surface in processing, it is necessary to detect the light emitted from the processed portion through the mask. It is difficult to detect the light emitted from the processed portion, when the light shielding layer of the mask is a metal film. Thus, the present invention cannot be applied in that case. This problem can be solved by making the light shielding layer of a dielectric multilayer film which selectively reflects only the oscillation wavelength of the laser. That is, this layer would shield only against laser light, but would be transparent to visible light, and therefore, it would be possible to observe the light emitted from the processed portion through the mask.

As mentioned above, the excimer laser ablation enables the formation of very well shaped holes faithful to the mask by a process of just exposure. As a result, excimer laser ablation has been getting attention as a technique for processing via holes in difficult-to-process films such as polyimide film. There is, however, a problem of deposition of soot at portions around the processing when patterning a polymer by an excimer laser.

This soot can cause a decline in the insulation resistance of the surface in the case of a multilayer wiring substrate. Thus, removal of the deposited soot is required. To remove the soot, immersion in alcohol or another liquid having a low surface tension and performing ultrasonic cleaning may be used. However, it is difficult to remove the soot completely and the black stain at the deposition portions cannot be removed. Another method is to perform the processing, while blowing helium gas or hydrogen gas. However, the use of helium gas means higher costs, the danger of explosion, and the inability of determining the endpoint of processing by detection of light emission.

According to the present invention, however, the generation of soot is suppressed by making the proximity of the surface of the organic material, being processed at the time of ablation processing by an excimer layer, an oxygen gas atmosphere, which is both high in combustion effect and inexpensive. Further, the increased intensity of the light emission is used to enable more reliable inspection of the endpoint of processing by detection of light emission.

Figure 3:
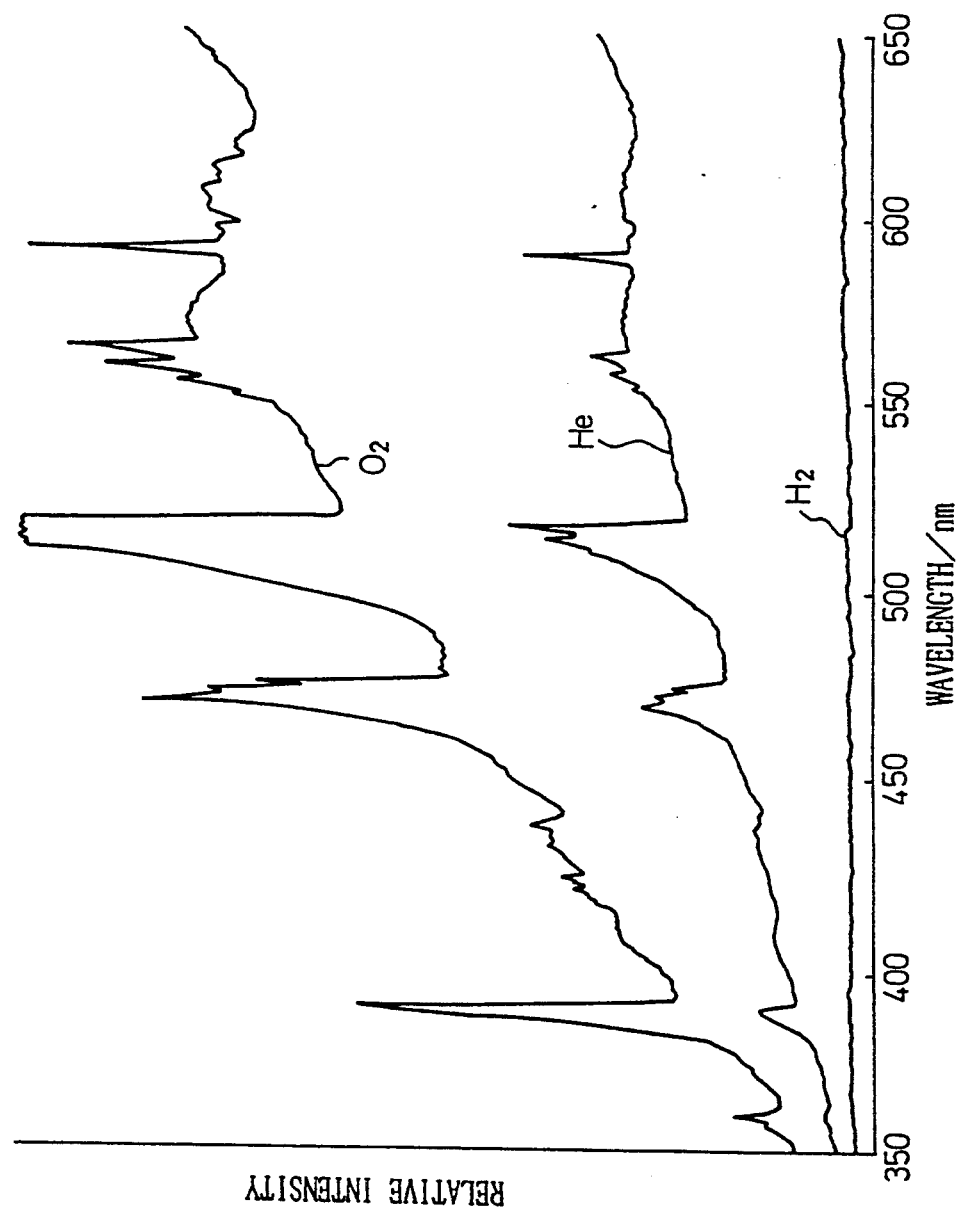
FIG. 3 is the spectra of light emission in the visible range during the ablation of a polyimide resin by a KrF excimer laser in an $H_2$, He, and $O_2$ gas atmosphere.

FIG. 3 shows the spectra of the light emission of the visible range in ablation of a polyimide resin by a KrF excimer laser in an atmosphere of helium gas, oxygen gas, and hydrogen gas. In the case of a hydrogen gas atmosphere, almost no light emission is detected, while in the case of helium gas, the intensity of the light emission is low. As opposed to this, in the case of oxygen gas, the intensity of the light emission remarkably increases and the light emission can be sufficiently detected even through a mask.

EXAMPLES

The present invention will now be further illustrated by, but is by no means limited to, the following Examples.

Example 1

Figure 4:
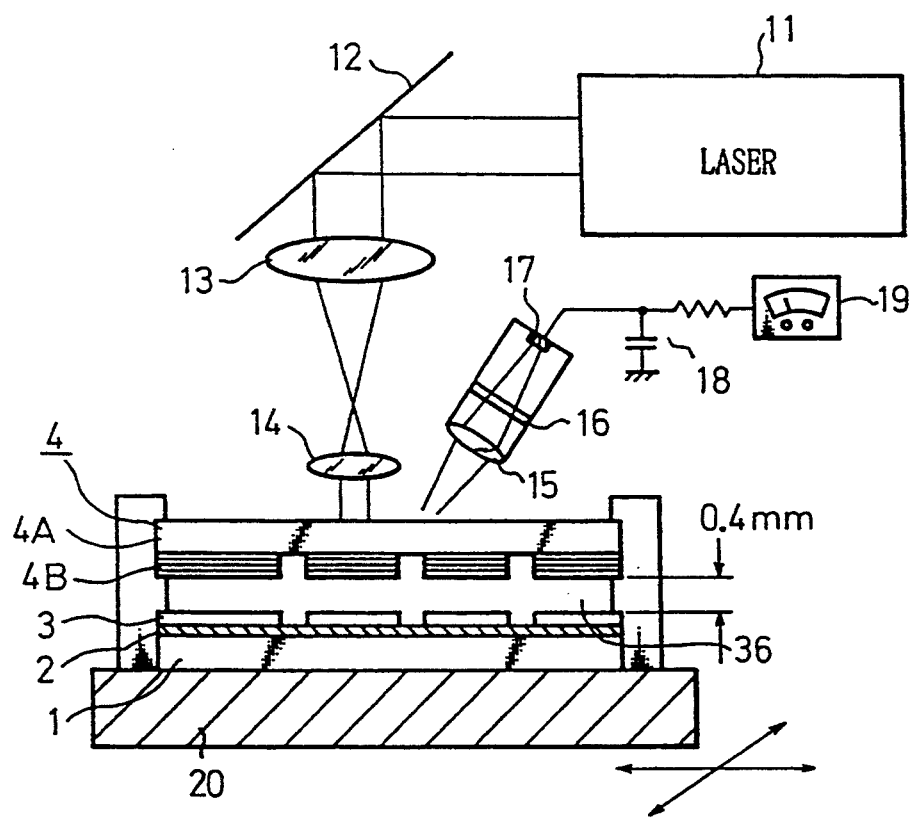
FIG. 4 is a view explaining Example 1.

FIG. 4 is a view explaining Example 1.

In FIG. 4, a copper (Cu) film 2 having a thickness of 2 $\mu$m was deposited on a glass substrate 1 by sputtering. On the top thereof, a polyimide film (Hitachi Kasei PIX-3500) was coated as a resin film 3 of a thickness of 40 $\mu$m. On the top thereof was placed a mask 4 at a gap of 0.4 mm. The assembly was affixed on an XY- stage 20. The stage was repeatedly moved in a zigzag manner and the laser 11 fired through the mirror 12 and the lenses 13 and 14 to form holes of a diameter of 50 $\mu$m in a 3 cm square region at a longitudinal and lateral pitch of 0.25 mm.

The processing conditions were as shown below:
Oscillation wavelength of laser: 248 nm (KrF)
Output: 300 mJ/pulse (pulse width 16 ns)
Repetition frequency of pulse: 200 Hz
Mask: Synthetic quartz substrate 4A on which is formed dielectric multilayer film 4B having pattern of holes of diameter of 40 $\mu$m
Exposure intensity: 1.0 J/cm$^2$ per pulse
Speed of travel in X-direction (main scanning direction): 40 mm/s (stroke 35 mm)
Steps in Y-direction (secondary scanning direction: 2 mm×18 steps The ablation processing was performed under the above conditions and the light emission during the processing was received by a photodetector 17 through a lens 15 and a color filter 16 capable of passing visible light of 500 to 700 nm. The average output over time was measured by a power meter 19 through an integration circuit 18.

The mask was transparent to visible light, and therefore, in was possible to monitor the light emission. The amount of light received in the first and second scanning was 300 $\mu$W, but fell to 220 $\mu$W in the third scan and became less than 10 $\mu$W in the fourth scan. Therefore, no fifth scan was performed and the processing was ended.

The processed holes were examined and as a result it was confirmed that all were formed as complete via holes and there was no damage to the underlying Cu film.

Example 2

Figure 5:
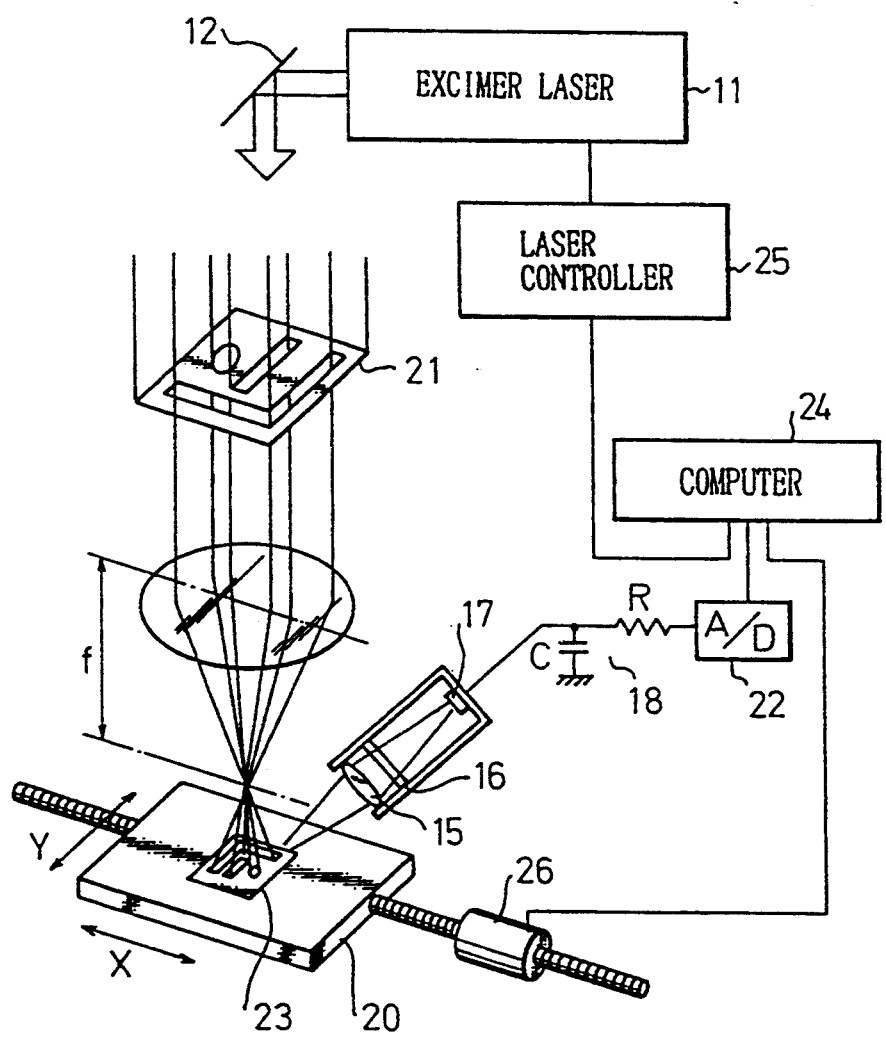
FIG. 5 is a view explaining Example 2.

FIG. 5 is a view explaining Example 2.

In FIG. 5, an aluminum (Al) film having a thickness of 3 $\mu$m was deposited on a glass substrate by sputtering. On the top thereof was coated a benzocyclobutene-based heat curing resin (available from Dow Chemical Co.) at a thickness of 30 $\mu$m as the resin film 3.

The laser light of the excimer laser 11 was passed through an aperture having a size of 5 mm×20 mm to cut the peripheral portions of the laser beam and to extract the portion with a uniform light intensity, then the light was passed through a mask 21 comprised of a 0.2 mm copper sheet in which holes of a diameter of 0.4 mm had been made at a pitch of 1 mm by a drill and reduced to ¼ for the processing. In the same way as in Example 1, the light emission was received by a photodetector 17, the amount of received light was measured through an integration circuit 18 which consists of a capacitance C in series with a resistance R for each pulse in synchronization with the laser oscillation, and the result was input to a computer 24 after A/D conversion by the A/D converter 22. The average light intensity ($I_0$) of the first five pulses after the start of the processing was found. When the amount of light intensity measured fell below 10 percent of the $I_0$ for five consecutive pulses, the laser controller 25 was actuated by instruction from the computer 24 to stop the oscillation of the laser 11. The stage 20 on which the workpiece (i.e., the substrate coated with resin film to be processed) 23 was then moved by 10 mm by a step motor 26 and the processing was then again performed. In this way, the processing was performed by a step and repeat process.

As a result, it was possible to expose the underlying Al film at all the holes without causing damage to the underlying Al film.

Example 3

Figure 6:
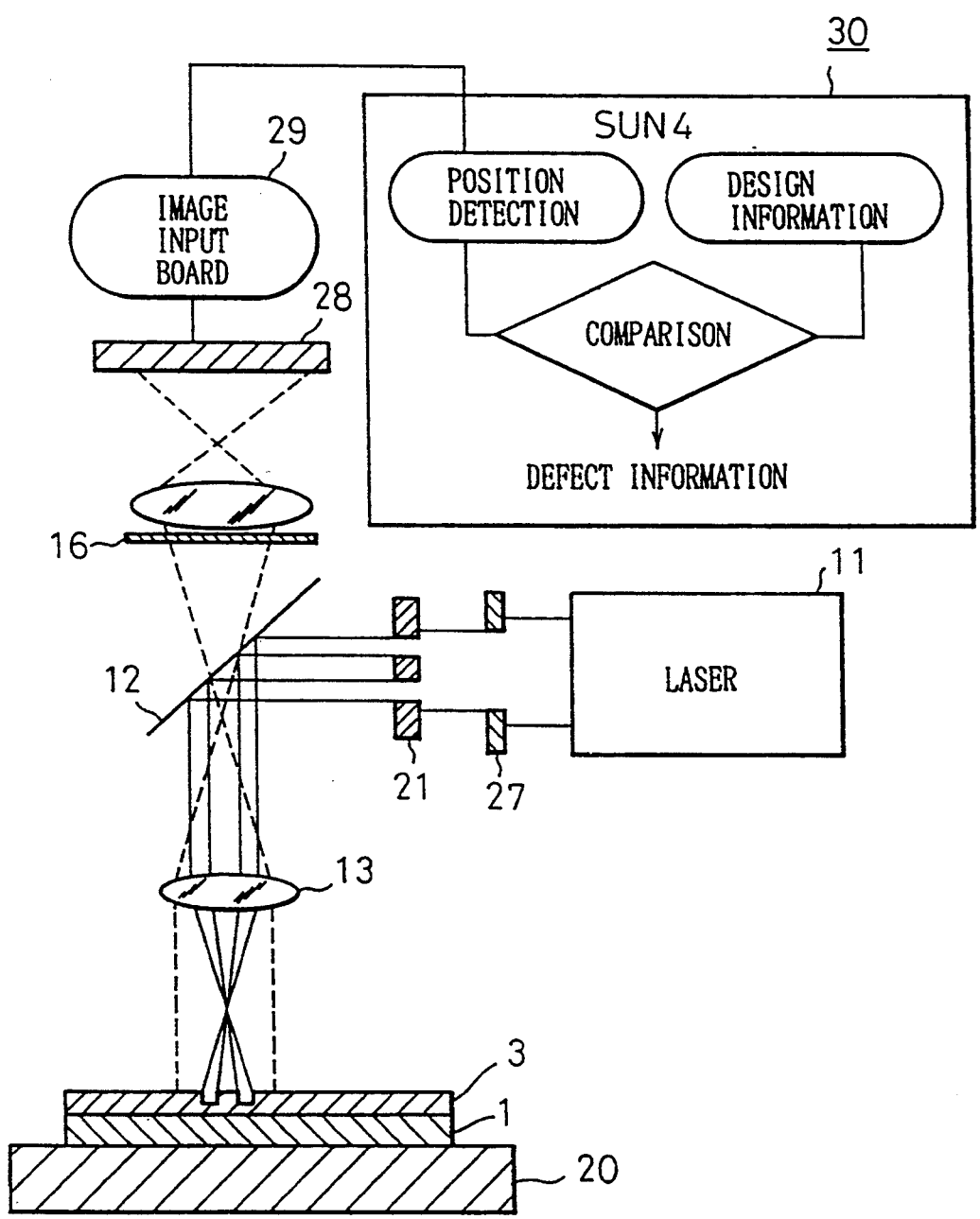
FIG. 6 is a view explaining Example 3.

FIG. 6 is a view explaining Example 3.

An underlying copper (Cu) film 3 was sputtered on a glass substrate 1 and lithographic techniques were used to form a pattern of electrodes of 60 $\mu$m$\Phi$ in a lattice form at a pitch of 200 $\mu$m. A polyimide film (Hitachi Kasei PIX-3500, thickness of 20 $\mu$m) was formed on the top thereof and then was processed to form via holes by the exposure system shown in FIG. 6. For the mask 21, use was made of a molybdenum sheet of a thickness of 0.2 mm in which holes of 0.2 mm$\Phi$ were formed in a lattice with a pitch of 0.8 mm by an electrodischarge processing method. A projection exposure method was performed at a reduction rate of 4.0 times. Laser light emitted from the laser 11 was passed through an aperture 27 having a size of 8×20 mm to remove the peripheral portions of the beam and then irradiated on the mask 21 to process a region having a size of 2.0×5.0 mm by a reduction projection method. For the laser 11, use was made of a Lumonics EX700. The oscillation wavelength was made 248 nm (KrF), the intensity of exposure was made 0.7 J/cm$^2$ per pulse, and the oscillation frequency was made 100 Hz. The light emitted from the processed portion was passed through the dielectric multilayer film mirror 12 of FIG. 6 and monitored by a CCD camera, through which visible light passes. It should be noted that, for the CCD photo element 28, use was made of one with a high resolution of 1000×1000 elements.

The image taken was passed through the image input board 29 and input every 0.1 s to a frame memory 30 of the work station. It was compared against the design information (via holes present at all lattice points at pitch of 200 μm) at cycles of 0.1 s to judge for the presence of defects and the mode of the same for every processing point in the design information. The position and mode of the defective portions were shown on a display.

(1) Detection of Modes of (a) and (c)

Metal pieces were adhered to the mask 21 to block four holes. Also, two holes of 0.2 mmΦ were made in the mask at positions other than the lattice points. Exposure was then performed. As a result, the four holes of the blocked holes were detected as the defects (a) and the positions corresponding to the two holes, made at locations other than the lattice points, were detected as the defects (c).

(2) Detection of Mode of (b)

A polyimide film having a thickness of 25 μm was cut into 1 mm squares and placed in a polyimide varnish. The result was coated on a substrate 1 on which electrodes had been formed so as to form locally uneven film portions. A location with one such film protrusion was processed using a normal mask. Irradiation was performed a further 0.5 second after the cessation of the light emission from 150 points among 250 light emission points and the location last emitting light was detected. As a result, the portion of builtup film caused by the piece of film was displayed on the screen as the defect (b).

Example 4

Figure 7:
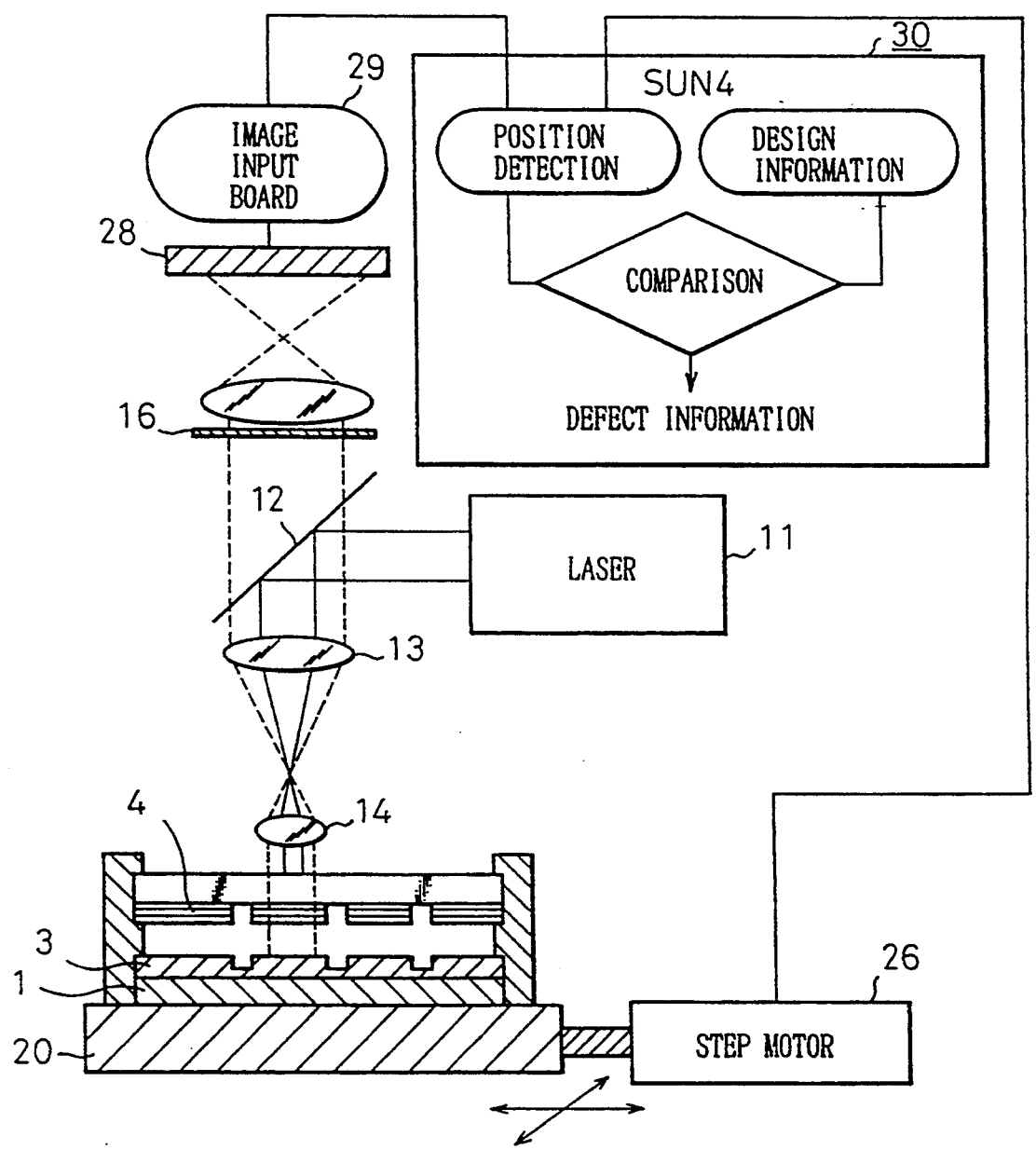
FIG. 7 is a view explaining Example 4.

Electrodes having a size of 40 μmΦ were formed at a pitch of 200 μm in a 5 cm square region on a 7 cm square glass substrate 1, as shown in FIG. 7, in the same way as in Example 3. On the top thereof, a benzocyclobutene heat curing resin (available from Dow Chemical Co., thickness of 25 μm) was formed as the resin film 3. Further, an SiO$_2$/Y$_2$O$_3$ dielectric multilayer film was laid on a synthetic quartz substrate having a thickness of 1 mm and 7 cm square to form a multilayer film mirror for 248 nm light. Holes having a size of 30 μmΦ were formed in a 5 cm square area in the 7 cm square region at a pitch of 200 μm, thereby forming the mask. The resin film and mask were positioned facing each other with a gap of 0.3 mm. Then the resin film and mask were affixed and placed on the XY-stage 20 as shown in FIG. 7. The laser light was focused by the first lens 13 so as to give 0.8 J/cm$^2$ per pulse at the beam center, then was converted to parallel light by the second lens 14 and passed through the dielectric mirror mask 4 to irradiate the workpiece. The laser 11 and the oscillation frequency were made the same as in Example 3.

Figure 8:
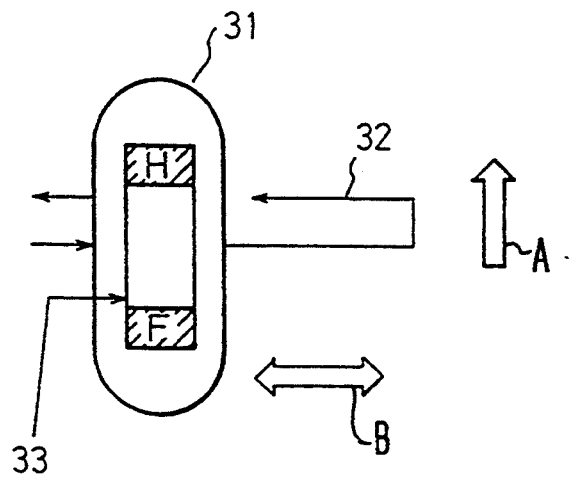
FIG. 8 is a view showing an irradiated portion and scanning and monitoring regions of Example 4.

While irradiating the laser light 11, the XY-stage 20 was moved 20 mm/s in the X-direction. When the pattern edge was passed, the stage was fed 1 mm in the Y-direction and then similarly moved in the -X-direction. The entire surface was therefore processed by this scanning in a zigzag pattern. The light emission at this time was passed through a mirror mask 4 and monitored in the same way as Example 3. In the same way as Example 3, the light emission was sampled each 0.1 second. The coordinates of the light emission points at that time were compared with signals from the step motor 26 moving the XY-stage 20 and calculated and compared against the design information to detect defects. In this Example, the size of the beam was about 3×8 mm at the irradiation portion 31, as shown in FIG. 8. In this Figure, A represents the direction of the secondary scan of the beam and B represents the direction of the main scan of the beam. The laser beam was repeatedly irradiated by a zigzag scan 32. A 2×6 mm region 33 at the center of the irradiated beam was monitored, the light emission positions at the leading portion (i.e., H in FIG. 8) in the direction of progression of the processing were detected (i.e., the detection of above-mentioned defects (a) and (c)), and the exposure of the electrodes at the final portion (i.e., F in FIG. 8) (i.e., the defects (b) and (d)) was detected.

Processing was performed by the above-mentioned method, using as a mask, a mask having the defects of (a) and (c). As a result, it was possible to detect the defects corresponding to these respective modes at locations detected in the mask defect inspection by the light emission during the processing.

Example 5

Figure 9:
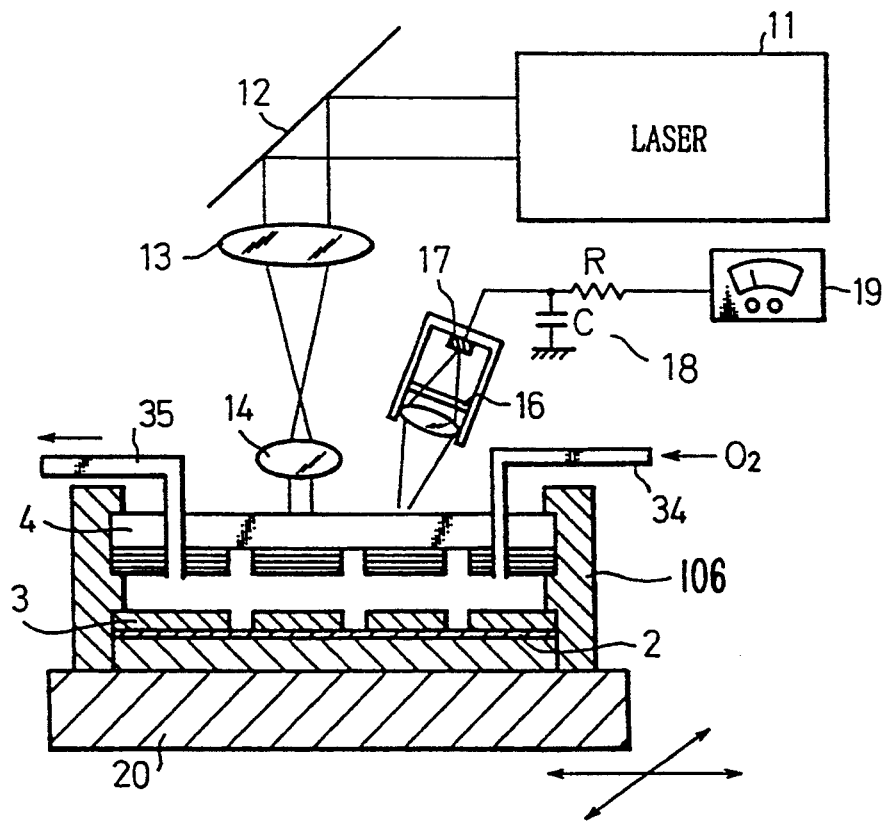
FIG. 9 is a view explaining Example 5.

A glass substrate 1 having an underlying metal (Cu) film 2 on which a polyimide film (Hitachi Kasei PIX-3500, thickness of 30 μm) was formed, as a resin film 3, was processed by the exposure system shown in FIG. 9 to form holes having a size of 50 μmΦ at a longitudinal and lateral pitch of 0.25 mm in a 3 cm square region.

The processing conditions were as shown below:
Laser oscillator: Lumonix EX-700
Oscillation wavelength: 248 nm (KrF)
Output: 300 mJ/pulse (pulse width 16 ns)
Exposure intensity: 1.0 J/cm$^2$ per pulse
Number of irradiation pulses: 200 pulses/shot
Reduction rate: 4:1
Flow of oxygen gas: 2 liters/minute Ablation processing was performed under the above conditions. A comparison was made of the generation of soot between the case of introducing O$_2$ from the oxygen gas inlet 34, the case of introducing hydrogen and helium gas instead of O$_2$, and the case of processing in the atmosphere. The amount of the soot was evaluated by the ratio of T$_1$/T$_0$, making a comparison of the average transmittance (measured by 5 mmΦ light, spatial average) between the state (T$_1$) of soot deposited directly after the processing and (T$_0$) after removal of the soot by rubbing cleaning. As a result, T$_1$/T$_0$ was a low of about 50% in processing in the atmosphere, but T$_1$/T$_0$ was about 95% in the case of passing hydrogen gas, about 87% in the case of helium gas, and about 84% in the case of oxygen gas, i.e., oxygen gas has substantially the same effect in reducing soot as hydrogen gas and helium gas.

Further, ablation processing was performed under the above conditions, the light emission during the processing was received by a photodetector 17 through a filter 16 passing visible light of 500 to 700 nm, and the average output along with time was measured through an integration circuit 18. The mask 4 allowed about 90% of the visible light to pass through it, and therefore, the light emission could be measured. The exposure system of FIG. 9 was affixed on the XY-stage 20 and processing was performed by the laser light emitted from the laser 11, while moving the stage 20 in a zigzag pattern. The speed of movement in the X-direction at this time was made 40 mm/s and the steps in the Y-direction were made 2 mm×18 steps. The amount of light received in the first scan was 450 μW in the case of an oxygen gas atmosphere, but was 40 μW in the case of a helium gas atmosphere. Almost no light emission could be observed in the case of a hydrogen gas atmosphere. Further, in the case of an oxygen gas atmosphere, a drop in the intensity of light emission was clearly seen in the fourth scan and the endpoint of the processing could be easily judged. However, in the case of a helium and hydrogen gas atmosphere, it was not easy to conclusively determine the endpoint of processing.

As explained above, according to Example 5 of the present invention, by making the proximity of the processed surface in excimer laser ablation processing an oxygen gas atmosphere, it is possible to effectively suppress the soot created at a low cost and to increase the intensity of light emission of the polymer ablation. As a result, much more reliable examination of the end of processing by detection of light emission becomes possible.

Example 6

Figure 10:
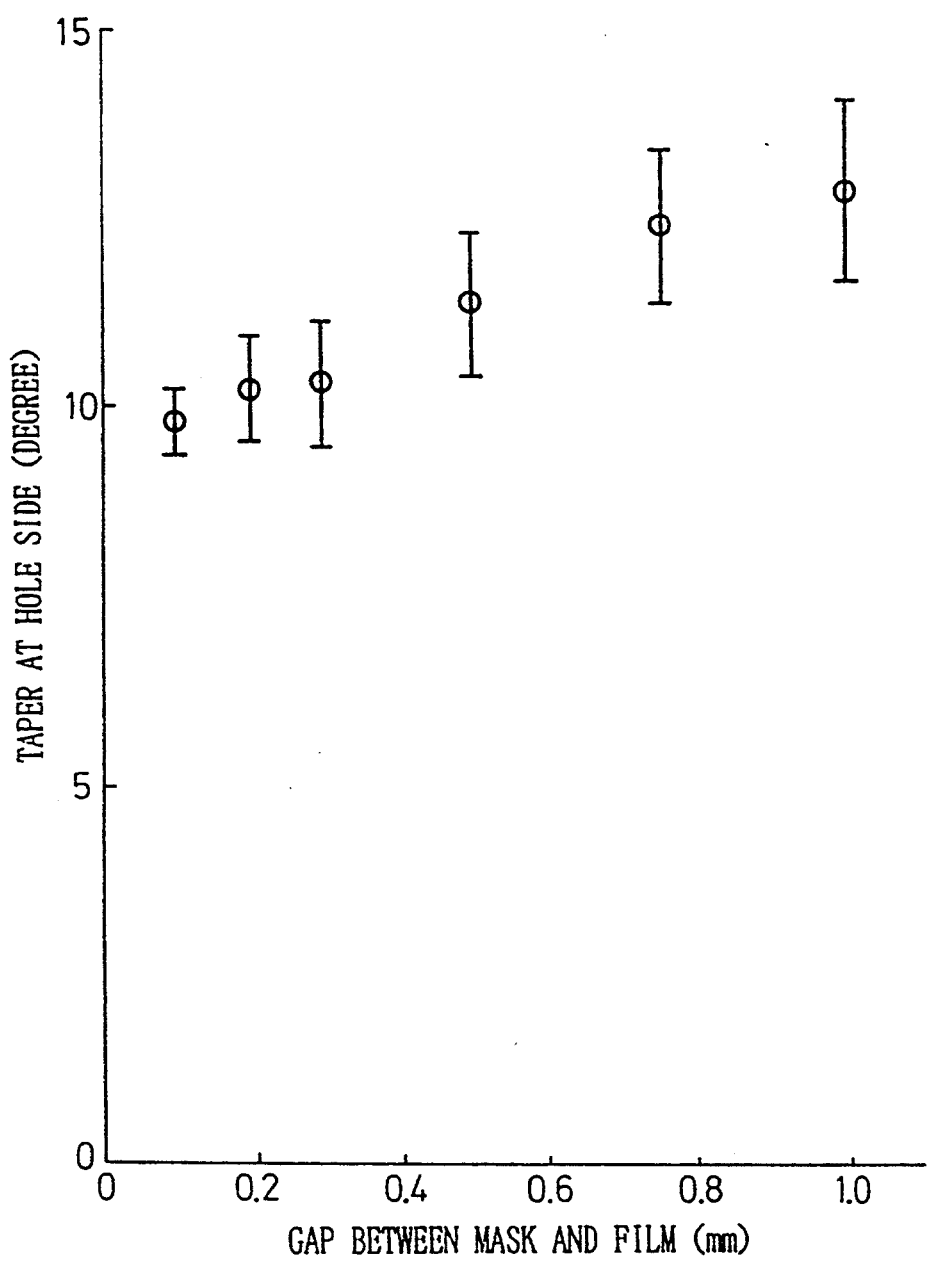
FIG. 10 is a graph showing the relationship between the taper angle of a via hole and the gap between the mask and film in Example 6.
Figure 11:
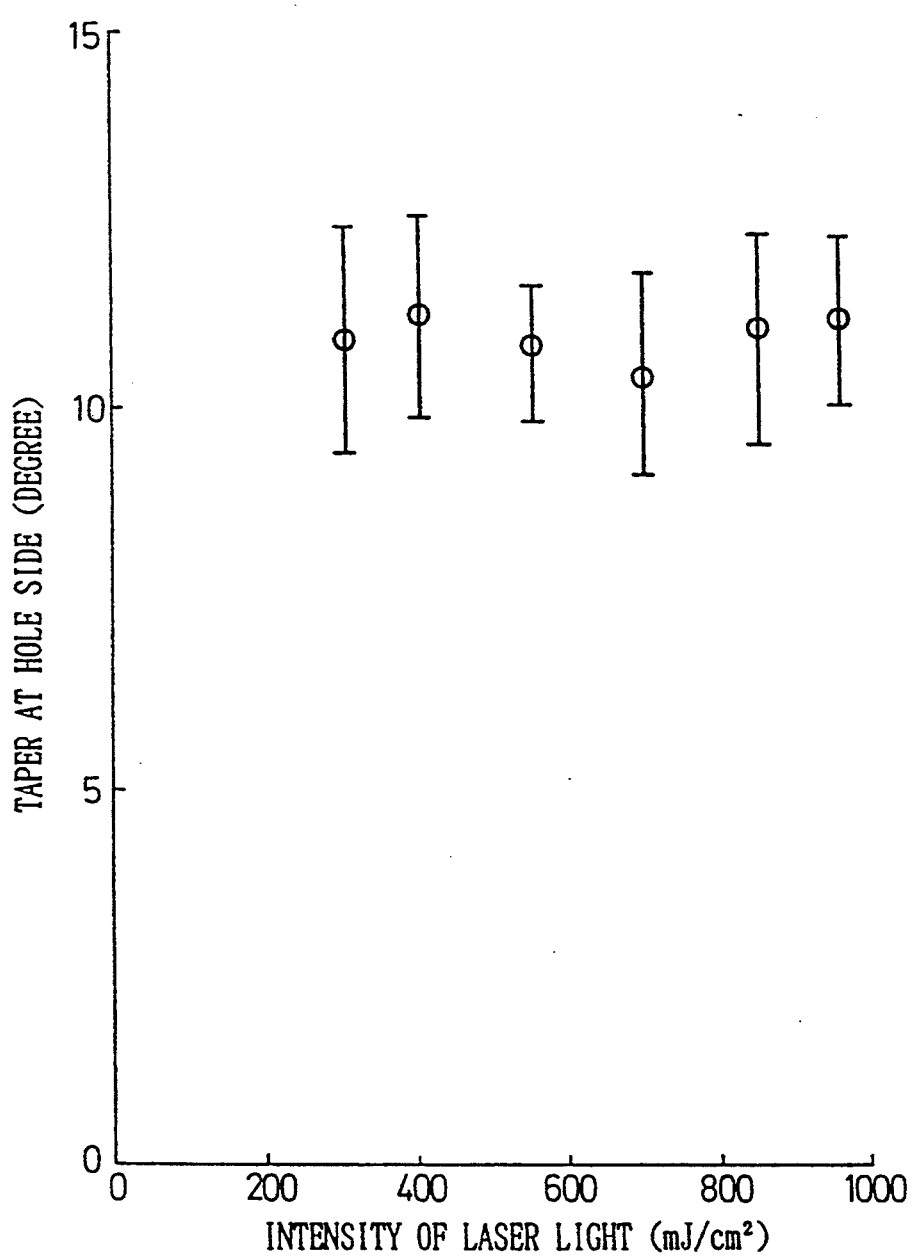
FIG. 11 is a graph showing the relationship between the taper angle of a via hole and the intensity of the laser beam in Example 6.

The excimer laser processing apparatus (i.e., an equivalent size mirror mask method) such as shown in FIGS. 4, 7, and 9 can be used to reliably form holes of a desired diameter at a desired taper angle, one of the goals of formation of via holes for interlayer connection in a polymer by an excimer laser in accordance with the trend toward diverser types of packaging and miniaturization of patterns. The apparatus requires, however, provision of a gap 36 (FIG. 4) of 0.1 to 1 mm between the processing surface 3 and the mask 4 to allow the ablation gas to escape. However, when a mask having a pattern of holes having a size of 5 to 50 μm diameter was used for the exposure and the relationship between the size of the gap and the shape of the holes formed was examined, since the degree of beam parallelness of an excimer beam cannot always be good, the diameter of the openings becomes larger than the diameter of the holes of the mask, the size of the gap 36 increases, the shape of the openings becomes oblate, and at the same time, the taper angle also becomes larger (see FIG. 10). Further, it was learned that no particular correlation exists between the intensity of the laser light and the taper angle (see FIG. 11). From these results, it may be necessary to control the gap in units of 0.1 mm so as to make holes of a desired diameter at a desired taper angle, in a film to be processed having a certain thickness. However, in the past the practice had been to place a spacer 106 having a certain thickness, of 0.5 mm or 1 mm, between the mask 4 and the film 3 to form the gap. Therefore, fine adjustment was difficult and, further, the spacers had to be changed one by one depending on the requirements on the via holes or the film to be processed.

Figure 12:
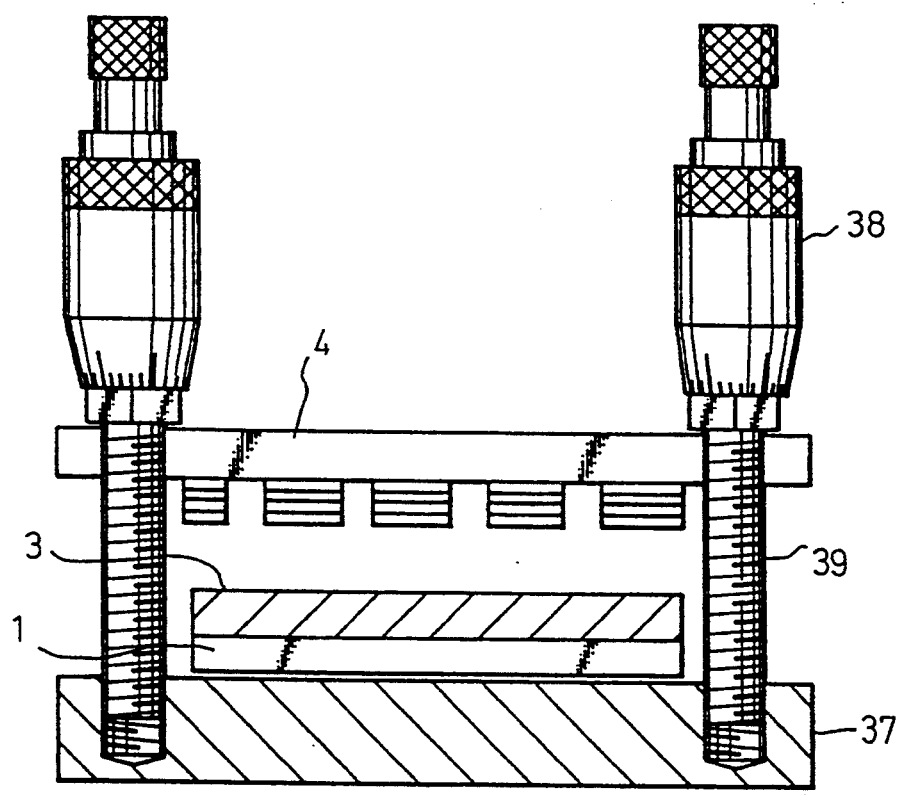
FIG. 12 is a view explaining Example 6.

However, in this Example, as shown in FIG. 12, use was made of an apparatus integrally comprising a work station 37 on which the material 3 to be processed is placed and screws 39, on which are mounted a mask 4, comprised of a transparent support substrate on which a dielectric multilayer film is selectively formed, and micrometer calipers 38. The distance from the surface of the film to be processed 3 to the surface of the mask 4 was measured as follows: First, the mask 4 was raised by the screws 39 to open up the distance between the mask 4 and the work station 37. The material to be processed, having a resin film 3 on its surface, was placed on the work station 37. Next, the mask 4 was lowered until lightly contacting the surface of the material to be processed. That was used as the reference point (i.e., zero point). The mask was then gradually raised while viewing the micrometer calipers 38 and stopped when a suitable position was reached.

Using the above method, a glass substrate 2 on which a polyimide film (Hitachi Kasei PIX-3500, thickness of 30 μm) was formed as a resin film 3, was processed by the exposure system shown in FIGS. 4, 7, and 9 to form holes at a longitudinal and lateral pitch of 0.25 mm in a 3 cm square region.

The processing conditions were as shown below:
Laser oscillator: Lumonics EX-700
Oscillation wavelength: 248 nm (KrF)
Output: 300 mJ/pulse (pulse width 16 ns)
Exposure intensity: 1.0 J/cm$^2$ per pulse
Number of irradiation pulses: 200 pulses/shot
Reduction rate: 4:1

The most suitable conditions for making via holes for interlayer connection having an opening diameter of 50 μm and a taper angle of 10° were studied, whereupon it was learned that use should be made of a mask with 40 μm hole diameters and the gap between the mask and film should be made 0.3 mm. Therefore, use was made of the apparatus of FIG. 12, use was made of a mask of the diameter of the conditions sought, the gap was set, and then the processing was performed. As a result, the opening diameter of the via holes formed was 40 μm and the taper angle was 12°—that is, the requirements could substantially be met.

According to the above Example 6, the adjustment of the gap provided between the processed material 3 and the mask 4 is performed by a screw mechanism 39 comprised of the support plate on which the processed material is placed and the mask. Therefore, it is possible to form via holes having a desired shape easily and reliably.

As explained above, according to a first aspect of the present invention, in ablation processing by an excimer laser, the required sufficient laser irradiation can be performed even in the face of fluctuations, in laser output, deterioration of the optical components, or differences in thickness of the processed article. Therefore, it is possible to prevent defective connections of the via holes due to incomplete processing or damage to the underlying electrode films.

Further, according to the second aspect of the present invention, it is possible to monitor the processing point by the light emission of the polymer ablation, and therefore, it is possible to inspect for defects in processing at the same time as the processing. Therefore, it is possible to substantially eliminate a separate inspection step.

We claim:

1. An excimer laser ablation processing method for processing a resin film by irradiation of an excimer laser thereby, to form via holes therein by decomposition thereof comprising the steps of:

detecting an emission of light of a visible range caused during the decomposition of the resin during the processing to measure the intensity thereof; and judging the endpoint of the processing from the changes in the intensity of light emission during the processing.

2. An excimer laser processing method as claimed in claim 1, wherein a mask obtained by selectively patterning a dielectric multilayer film is placed on the resin film, processing is performed by laser light passing through the mask, and the intensity of light emission is measured through the mask.

3. An excimer laser ablation processing apparatus for processing a resin film by irradiation of an excimer laser thereby, to form via holes therein by decomposition thereof, comprising:

means for detecting an emission of light of a visible range caused during the decomposition of the resin during the processing and measuring of the intensity thereof; and means for judging the endpoint of the processing from the changes in the intensity of light emission during the processing.

4. An excimer laser processing apparatus as claimed in claim 3, wherein a mask obtained by selectively patterning a dielectric multilayer film is placed on the resin film, the processing is performed by laser light passing through the mask, and the intensity of light emission is measured through the mask.

5. An excimer laser ablation processing method for processing a resin film by irradiation of an excimer laser thereby to form via holes therein by decomposition thereof, comprising the steps of:

detecting an emission of light of a visible range caused during the decomposition of the resin during the processing;

detecting the positions of light emission from the resin film;

comparing the detected positions of light emission and respective design positions of processing against each other; and using the comparison of the detected positions of light emission and respective design positions to inspect the presence of defects.

6. An excimer laser processing method as claimed in claim 5, wherein a mask obtained by selectively patterning a dielectric multilayer film is placed on the resin film, the processing is performed by laser light passing through the mask, and the intensity of light emission is measured through the mask.

7. An excimer laser processing method as claimed in claim 5, wherein the resin film is a layer insulation film in a multilayer circuit substrate of an electronic circuit.

8. An excimer laser ablation processing apparatus for processing a resin film by irradiation of an excimer laser thereby to form via holes therein by decomposition thereof, comprising:

means for taking an image of an emission of light of a visible range caused during the decomposition of the resin during the processing;

means for identifying positions of light emission from the resin film;

means for comparing the identified positions of the light emission and respective design positions of the via holes to be formed in the resin film; and means for using the comparison of the respective positions of light emission and of the design positions to inspect for the presence of defects.

9. An excimer laser processing apparatus as claimed in claim 8, wherein a mask obtained by selectively patterning a dielectric multilayer film is placed on the resin film, the processing is performed by laser light passing through the mask, and the intensity of light emission is measured through the mask.

10. An excimer laser processing apparatus as claimed in claim 8, wherein the processing apparatus is an apparatus for forming via holes in an insulating resin forming part of an electronic circuit substrate.

11. An excimer laser processing apparatus as claimed in claim 9, wherein:

the light emission is observed from a specific position over time; and the end of processing for that apparatus is judged by the cessation of light emission from the specific position.

12. An excimer laser ablation processing method as claimed in claim 1, further comprising the step of using an oxygen gas atmosphere in the proximity of the surface of a processed material during processing.

13. An excimer laser ablation processing method for forming via holes in a resin film, comprising the steps of:

irradiating a portion of the resin film with light produced by an excimer laser thereby to decompose the irradiated portion of the resin film;

detecting an emission of light caused by the decomposition of the resin film which occurs during excimer laser ablation processing and measuring the intensity of the light emission; and judging an endpoint of the excimer laser ablation processing from measured changes in the intensity of light emission during the excimer laser ablation processing.

14. An excimer laser processing method, as claimed in claim 13, further comprising:

placing a mask, obtained by selectively patterning a dielectric multilayer film, on the resin film;

passing the light produced by the excimer laser through the mask; and detecting the emission of light and measuring the intensity of the light emission through the mask.

15. An excimer laser ablation processing apparatus for forming via holes in a resin film by irradiating a portion of the resin film with light produced by an excimer laser thereby to decompose the irradiated portion of the resin film, said excimer laser ablation processing apparatus comprising:

means for detecting light emission caused during decomposition of the resin film during the excimer laser ablation processing and measuring the intensity of the light emission; and means for judging an endpoint of the excimer laser ablation processing by detecting changes in the measured intensity of the light emission during the excimer laser ablation processing.

16. An excimer laser processing apparatus as claimed in claim 15, further comprising:

a mask, obtained by selectively patterning a dielectric multilayer film, placed on the resin film; and wherein the excimer laser passes light through the mask, and the emission of light is detected and the intensity of light emission is measured through the mask.

17. An excimer laser ablation processing method for forming via holes in a resin film comprising the steps of:
  irradiating a portion of the resin film with light produced by an excimer laser thereby to decompose the irradiated portion of the resin film;
  detecting emissions of light caused by the decomposition of the resin film during the excimer laser ablation processing, each emission of light being emitted from a position on the resin film;
  detecting the position of each emission on the resin film from which the emission of light emanates; and
  determining defects by comparing the detected positions of light emission and design positions of processing.

18. An excimer laser processing method as claimed in claim 17, further comprising the steps of:
  placing a mask, comprising selectively patterned dielectric multilayer film, on the resin film;
  passing excimer laser light through the mask; and
  measuring the intensity of the light emission through the mask.

19. An excimer laser processing method as claimed in claim 17, wherein the resin film is a layer insulation film in a multilayer circuit substrate of an electronic circuit.

20. An excimer laser ablation processing apparatus for forming via holes in a resin film by irradiating a portion of the resin film with light produced by an excimer laser thereby to decompose the irradiated portion of the resin film, said excimer laser ablation processing apparatus comprising:
  means for taking an image of emissions of light caused during the decomposition of the resin film during the excimer laser ablation processing, each emission of light emanating from a position on the resin film;
  means for identifying the respective position of each light emission; and
  means for detecting defects by comparing the identified positions of light emission and respective design positions for formation of the via holes.

21. An excimer laser processing apparatus as claimed in claim 20, further comprising:
  a mask, obtained by selectively patterning a dielectric multilayer film, placed on the resin film,
  means for passing light from the excimer laser through the mask; and
  means for measuring the intensity of each emission of light through the mask.

22. An excimer laser processing apparatus as claimed in claim 20, wherein the processing apparatus is an apparatus for forming via holes in an insulating resin forming part of an electronic circuit substrate.

23. An excimer laser processing apparatus as claimed in claim 21, further comprising:
  means for observing the emissions of light from a selected position, on the resin film over time; and
  means for judging the end of excimer laser ablation processing by detecting a cessation of emissions of light from said selected position.

24. An excimer laser ablation processing method, as claimed in claim 13, wherein the excimer laser processing method uses an oxygen gas atmosphere adjacent to the surface of a processed material during excimer laser ablation processing.

* * * * *

UNITED STATES PATENT AND TRADEMARK OFFICE
CERTIFICATE OF CORRECTION

PATENT NO. : 5,386,430
DATED : January 31, 1995
INVENTOR(S) : Yasuo YAMAGISHI et al.

It is certified that error appears in the above-indentified patent and that said Letters Patent is hereby corrected as shown below:

Col. 7, line 63, after "steps", insert a comma (",").
Col. 13, line 28, after "mask", insert a comma (",");
Line 29, after "film", insert a comma (",");
Line 50, after "film", insert a comma (",");

Signed and Sealed this

Fourth Day of July, 1995

BRUCE LEHMAN

Attest:

*Attesting Officer*         *Commissioner of Patents and Trademarks*

UNITED STATES PATENT AND TRADEMARK OFFICE
CERTIFICATE OF CORRECTION

PATENT NO. : 5,386,430
DATED : January 31, 1995
INVENTOR(S) : Yasuo Yamagishi, et al.

It is certified that error appears in the above-indentified patent and that said Letters Patent is hereby corrected as shown below:

```
Col. 7, line 63, after "steps", insert a comma (",").
Col. 13, line 28, after "mask", insert a comma (",");
     Line 29, after "film", insert a comma (",");
     Line 49, after "mask", insert a comma (",");
     Line 50, after "film", insert a comma (",").
```

This certificate supersedes Certificate of Correction issued July 4, 1995.

Signed and Sealed this

Twenty-second Day of August, 1995

Attest:

BRUCE LEHMAN

*Attesting Officer*  *Commissioner of Patents and Trademarks*